(12) United States Patent
Wu

(10) Patent No.: US 6,479,852 B1
(45) Date of Patent: Nov. 12, 2002

(54) MEMORY CELL HAVING A DEEP TRENCH CAPACITOR AND A VERTICAL CHANNEL

(75) Inventor: Joseph Wu, Hsinchu Hsien (TW)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 09/983,681

(22) Filed: Oct. 25, 2001

(51) Int. Cl.$^7$ ................................................ H01L 29/76
(52) U.S. Cl. .................. 257/301; 257/68; 257/302; 257/303; 257/304; 257/306; 257/311; 257/318; 438/242; 438/243; 438/244
(58) Field of Search .................. 257/68, 301, 302, 257/303, 304, 306, 311, 318; 438/242, 243, 244

(56) References Cited

U.S. PATENT DOCUMENTS

| | | | |
|---|---|---|---|
| 4,649,625 A | * 3/1987 | Lu | 29/571 |
| 4,912,535 A | * 3/1990 | Okumura | 357/23.6 |
| 5,065,273 A | * 11/1991 | Rajeevakumar | 361/313 |
| 5,181,089 A | * 1/1993 | Matsuo et al. | 257/299 |
| 5,214,603 A | * 5/1993 | Dhong et al. | 365/207 |
| 5,336,629 A | * 8/1994 | Dhong et al. | 437/52 |
| 6,034,389 A | 3/2000 | Burns, Jr. et al. | |

* cited by examiner

Primary Examiner—Eddie Lee
Assistant Examiner—Edgardo Ortiz
(74) Attorney, Agent, or Firm—Birch, Stewart, Kolasch & Birch, LLP

(57) ABSTRACT

A semiconductor memory cell has a deep trench capacitor and a vertical transistor formed over the deep trench capacitor. The vertical transistor has a control gate electrode, a source/drain region at opposite sides of the control gate electrode, and a channel region surrounding the sidewall and top of the control gate electrode. This can increase the length of the channel region to reduce leakage current.

17 Claims, 19 Drawing Sheets

MEMORY CELL HAVING A DEEP TRENCH CAPACITOR AND A VERTICAL CHANNEL

BACKGROUND OF THE INVENTION

1. Field of the Invention

The present invention relates to memory cell and, more particularly, to a dynamic random access memory (DRAM) cell having a deep trench capacitor and a vertical transistor. The vertical transistor has a channel region that surrounds the sidewall and top of a control gate electrode to provide sufficient channel length and decrease leakage current.

2. Description of the Related Art

There is much interest in reducing the size of individual semiconductor devices to increase their density on an integrated circuit (IC) chip. This reduces size and power consumption of the chip, and allows faster operation of the chip. In order to achieve a memory cell with a minimum size, the gate length in a conventional transistor must be reduced to decrease the lateral dimension of the memory cell. However, the shorter gate length will result in higher leakage currents that cannot be tolerated, and the voltage on the bit line must therefore also be scale down. This reduces the charges stored on a storage capacitor, and thus requires a larger capacitance to ensure that stored charges are sensed correctly.

In order to solve the above-mentioned problems, a stacked capacitor and a deep trench capacitor have been developed for a high-integration memory cell, such as dynamic random access memory (DRAM) cell. Especially, the deep trench capacitor is formed in a deep trench within the silicon substrate, thus the capacitor storage region cannot consume any additional wafer area. In addition, a vertical transistor has recently been developed which can maintain the gate length at a suitable value for obtaining low leakage, without decreasing the bit line voltage or increasing the memory cell's lateral dimension.

A type of vertical transistor with a deep trench capacitor is disclosed in U.S. Pat. No. 6,034,389. As shown in FIG. 1, a P-type silicon substrate 10 comprises a plurality of deep trenches 11 and a plurality of pillars 12 corresponding to the deep trenches 11. In the lower region of the deep trench 11, an $n^+$-type diffusion region 13 is formed on the sidewall of the pillar 12 to serve as a source region of a vertical transistor and a storage node of a deep trench capacitor, a $p^+$-type electric-field isolating region 14 formed on the bottom of the deep trench 11 to ensure an appropriate isolation between the adjacent $n^+$-type diffusion regions 13, an ONO thin film 15 formed on the sidewall of the deep trench 11 to serve as a capacitor dielectric of the deep trench capacitor, and an $n^+$-type polysilicon layer 16 fills the lower region of the deep trench 11 to serve as an electrode plate of the deep trench capacitor.

In the upper region of the deep trench 11, a barrier oxide layer 17 covers the top of the $n^+$-type polysilicon layer 16, two $n^+$-type polysilicon layers 19 patterned as two adjacent word lines are formed on the barrier oxide layer 17 to serve as two control gate electrodes, a gate oxide layer 18 is formed on the sidewall of the deep trench 11 to surround the control gate electrodes 19, an $n^+$-type diffusion region 20 is formed on the top of the pillar 12 to serve as a drain region of the vertical transistor, and a metal layer 22 is formed over the vertical transistor and perpendicular to the word lines to serve as a bit line.

According the above-described memory cell, the $n^+$-type polysilicon layers 19, the $n^+$-type diffusion region 13 and the $n^+$-type diffusion region 20 form the vertical transistor, and the $n^+$-type diffusion region 13, the ONO thin film 15 and the $n^+$-type polysilicon layers 16 form the deep trench capacitor. In an open bit line case as described, the storage node of the deep trench capacitor is common to all the memory cells in the array, and the charge is stored on the $n^+$-type diffusion region 13 within each pillar 12. In addition, a channel region 24 between the $n^+$-type diffusion regions 13 and 20 is formed on the sidewall of the pillar 12 to serve as a strip-shaped channel of the vertical transistor.

In order to prevent leakage current in the OFF state, a sufficient length of the channel region 24 is required. One method of achieving this is to fabricate the deep trench 11 with a greater depth, but the depth is restricted by process limitations. The other way is to adjust the size ratio of the deep trench capacitor to the vertical transistor within the deep trench 11, but this creates difficulties in tuning electrical performance.

SUMMARY OF THE INVENTION

The present invention provides a DRAM cell having a deep trench capacitor and a vertical transistor, in which a channel region has sufficient length to reduce leakage current.

The DRAM cell is formed on a substrate having a plurality of deep trenches arranged in array. Within each deep trench, a deep trench capacitor is formed with a storage node formed in the substrate and surrounding the deep trench, a capacitor dielectric is formed on the sidewall of the deep trench, and an electrode plate fills the deep trench. An isolating layer covers the deep trench capacitor and has a first contact hole to expose a predetermined region of the electrode plate, wherein the exposed region of the electrode plate is a first doped region. A control gate electrode is patterned on the isolating layer over the deep trench capacitor, wherein the first doped region is formed at one side of the control gate electrode. A gate insulating layer covers the sidewall and top of the control gate electrode. A well Si layer covers the isolating layer, the gate insulating layer and the exposed electrode plate to fill the first contact hole. The well Si layer comprises a second doped region formed at the other side of the control gate electrode.

Accordingly, it is a principal object of the invention to provide the deep trench arranged in array and having a large lateral size.

It is another object of the invention to provide the deep trench capacitor below the vertical transistor without consuming lateral size of the DRAM cell.

Yet another object of the invention is to provide a channel region surrounding the sidewall and top of the control gat electrode.

It is a further object of the invention to increase the length of the channel region to reduce leakage current.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The present invention provides DRAM cells that are patterned in array by perpendicular intersections of word lines and bit lines. The DRAM cell may be applied to a folded bit line structure or an open bit line structure. Each memory cell has a vertical transistor and a deep trench capacitor formed below the vertical transistor. The vertical transistor has a channel region surrounding the sidewall and top of the gate electrode to keep an appropriate channel length. This can reduce leakage current without consuming lateral area of the memory cell.

[First Embodiment]

The first embodiment provides a DRAM cell applied to the folded bit line structure, in which each active region (AA) has two active gate electrodes and a bit line and the gate electrodes arrange by a specific rule over a deep trench. FIGS. 2, 4, 6, 8, 10, 12 and 14 are top views showing the DRAM cell according to the first embodiment of the present invention. FIGS. 3, 5, 7, 9, 11, 13 and 15 are sectional diagrams showing the DRAM cell according to the first embodiment of the present invention.

Figure 1:
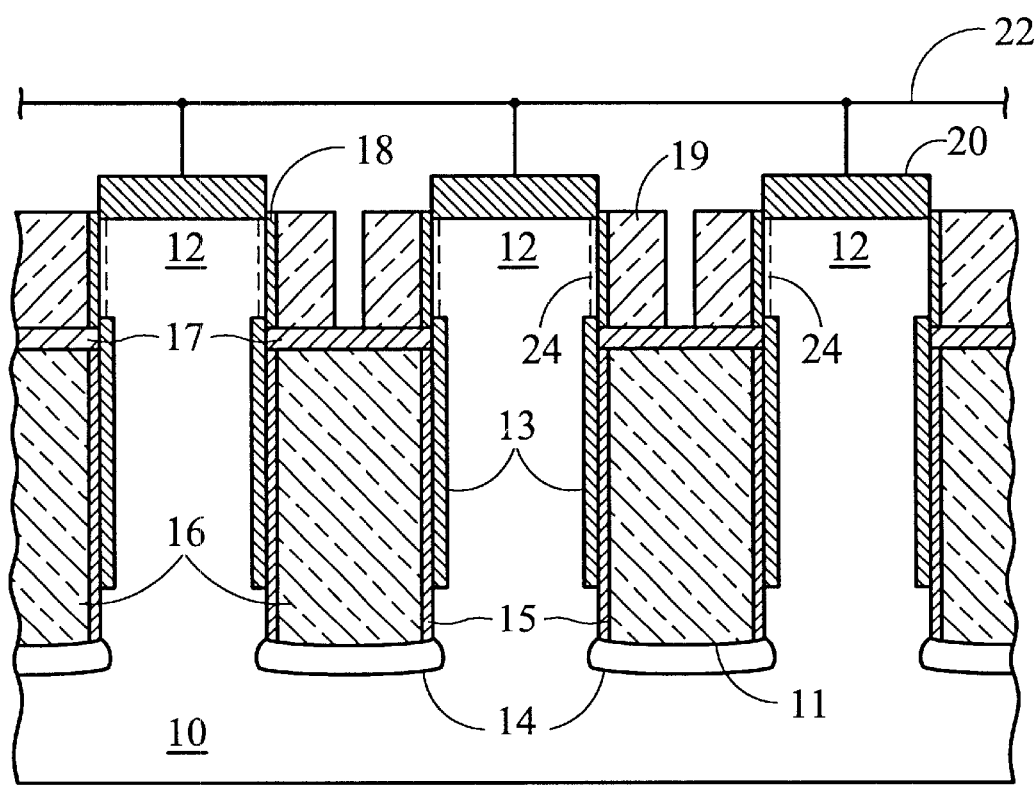
FIG. 1 is a sectional diagram showing a vertical transistor with a deep trench capacitor according to the prior art.
Figure 2A:
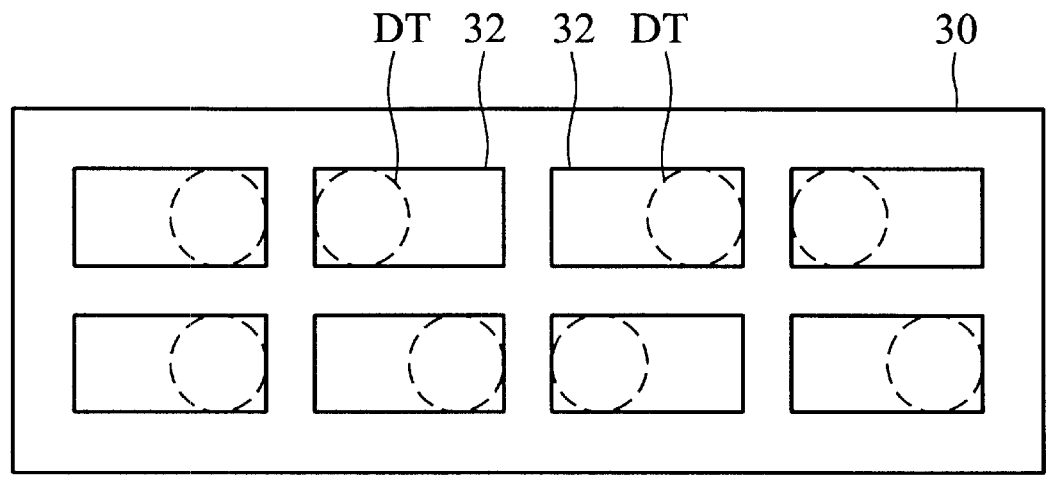
FIGS. 2A and 2B are top views showing deep trenches according to the first embodiment of the present invention.
Figure 2B:
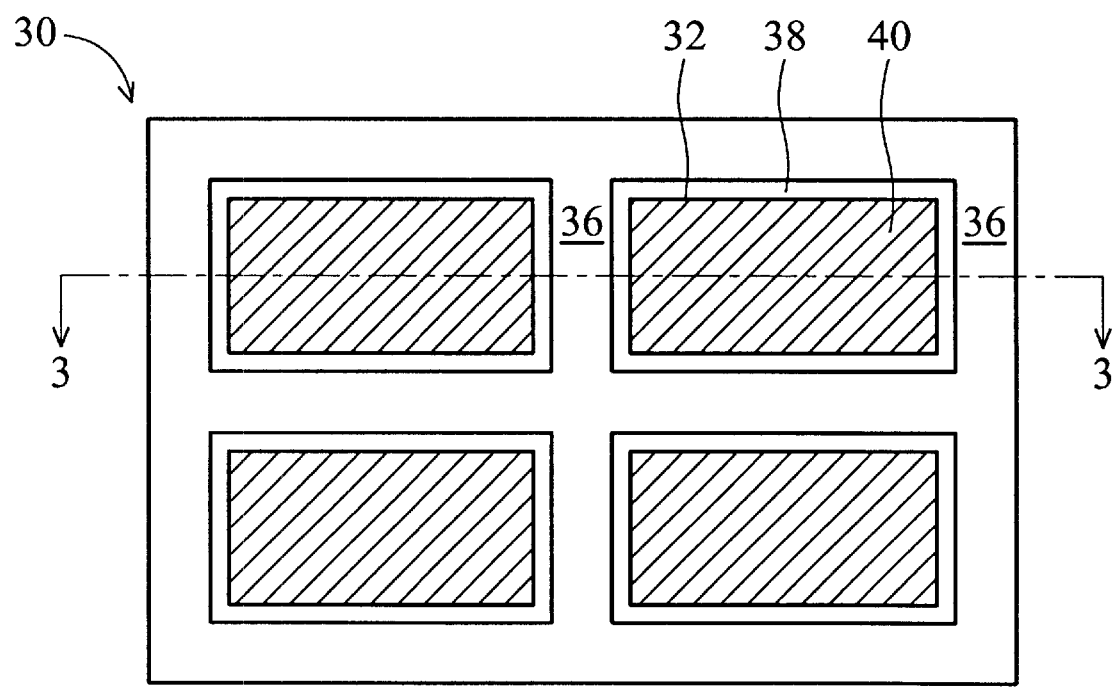
Figure 3A:
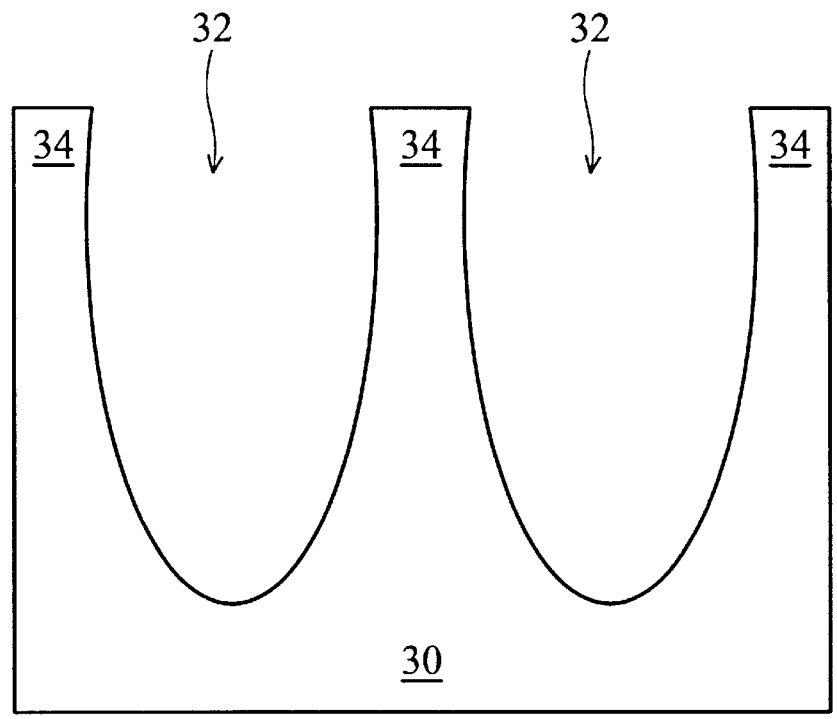
FIGS. 3A to 3C are sectional diagrams along line 3—3 shown in FIG. 2.
Figure 3B:
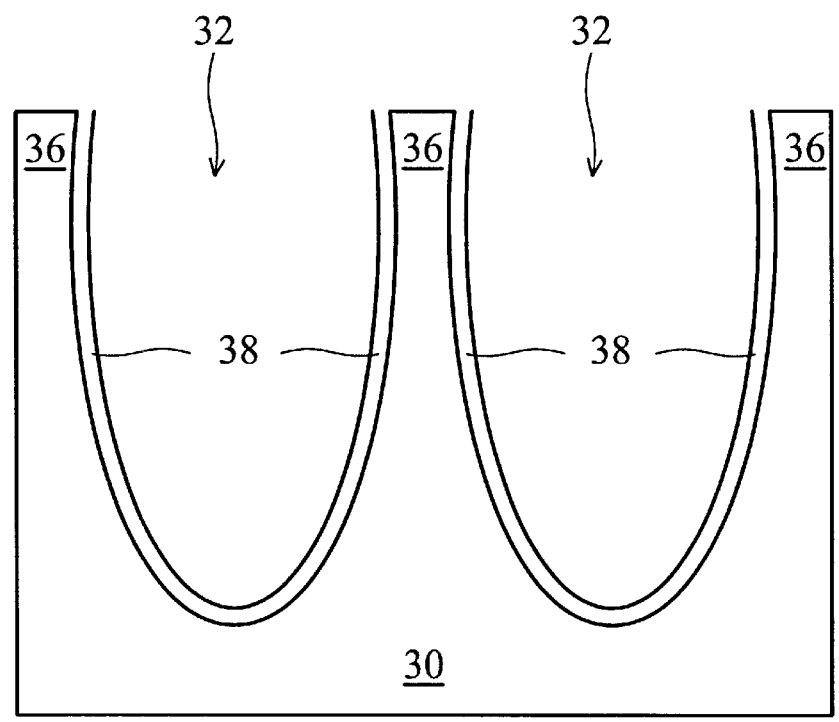
Figure 3C:
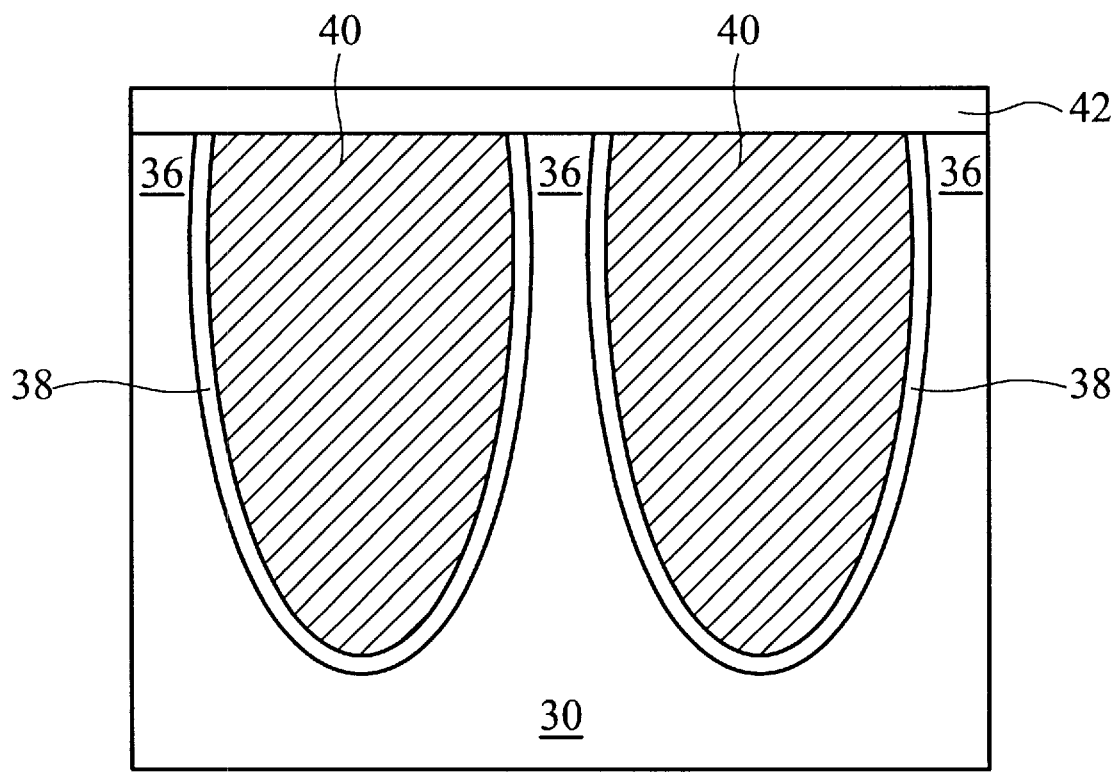

Please refer to FIGS. 2 and 3. FIGS. 2A and 2B are top views showing deep trenches according to the first embodiment of the present invention. FIGS. 3A to 3C are sectional diagrams along line 3—3 shown in FIG. 2. As shown in FIG. 2A, compared with the location and size of the conventional deep trenches DT, the first embodiment provides a plurality of deep trenches 32 with a larger lateral size and arranged in array. This improves the process property of the deep trench 32 and provides a larger capacitance subsequently formed in the deep trench 32. In fabricating a deep trench capacitor, as shown in FIG. 3A, photolithography and etching are used on a P-type silicon substrate 30 to form the deep trenches 32 and corresponding pillar regions 34. Then, as shown in FIG. 3B, an ASG layer used as a source diffusion material and an oxide layer are successively deposited on the sidewall and bottom of the deep trenches 32. A short-term and high-temperature annealing process is then performed to diffuse arsenic ions into the sidewall of the pillar region 34, resulting in an $n^+$-type diffusion region 36 that surrounds the deep trench 32. Next, as shown in FIG. 3B, after removing the oxide layer and the ASG layer, a NO dielectric 38 comprising an oxide layer and a silicon nitride layer is formed on the sidewall of the deep trench 32. Thereafter, as shown in FIG. 3C, chemical vapor deposition (CVD) is used to fill the deep trenches 32 with an undoped polysilicon layer 40, and then etching back is used to recess the polysilicon layer 40 to level off the tops of the NO dielectric 38, the pillar regions 34 and the polysilicon layer 40. Next, a first insulating layer 42 is formed on the planarized surface of the silicon substrate 30. Accordingly, a deep trench capacitor is completed with the $n^+$-type diffusion region 36 as a storage node, the NO dielectric 38 as a capacitor dielectric and the polysilicon layer 40 as an electrode plate. The first insulating layer 42 of silicon oxide is employed to isolate a control gate electrode subsequently formed over the deep trench capacitor.

Figure 4:
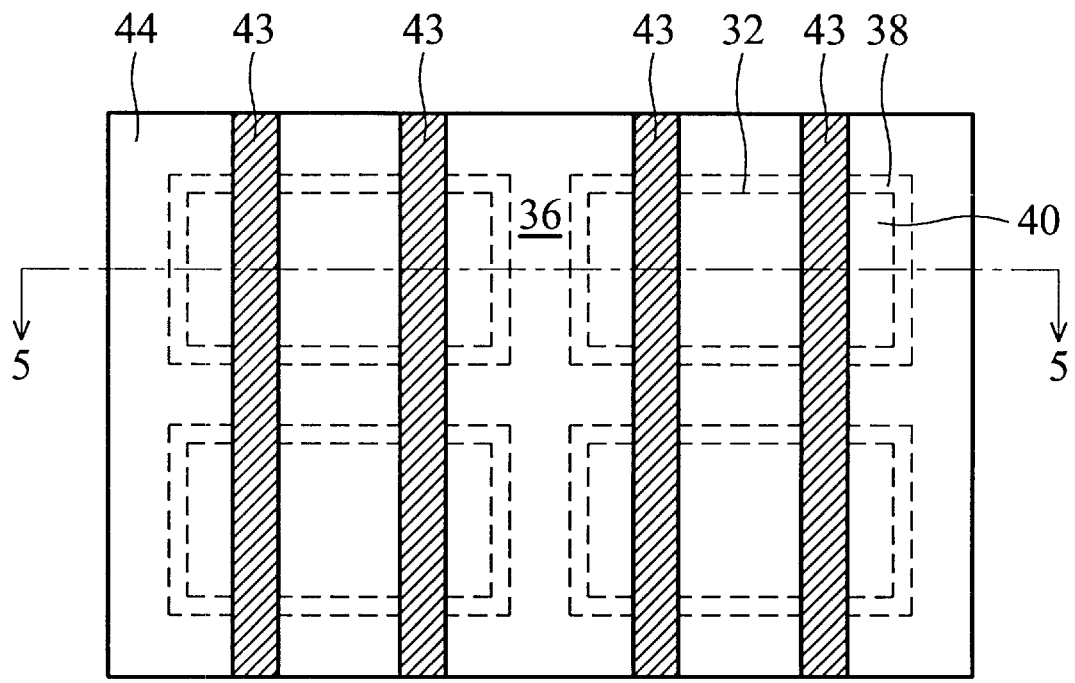
FIG. 4 is a top view showing word lines.
Figure 5:
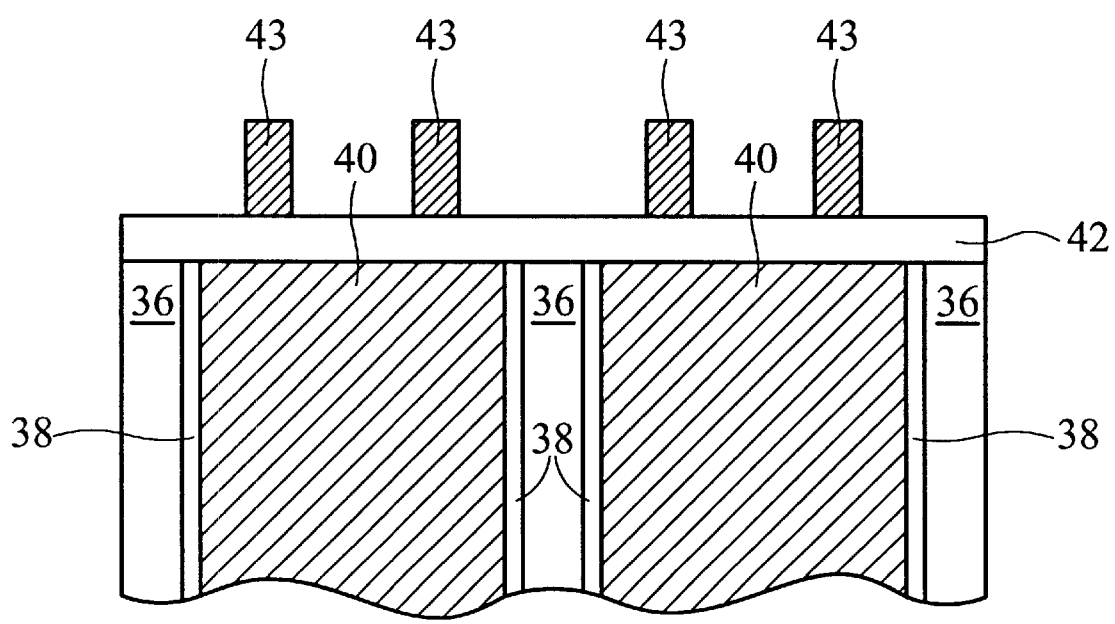
FIG. 5 is a sectional diagram along line 5—5 shown in FIG. 4.

Please refer to FIGS. 4 and 5. FIG. 4 is a top view showing word lines. FIG. 5 is a sectional diagram along line 5—5 shown in FIG. 4. Using deposition, photolithography and etching, an $n^+$-type polysilicon layer formed on the first insulating layer 42 is patterned as a plurality of word lines 43. Over each deep trench 32, two word lines 43 are formed lengthwise.

Figure 6:
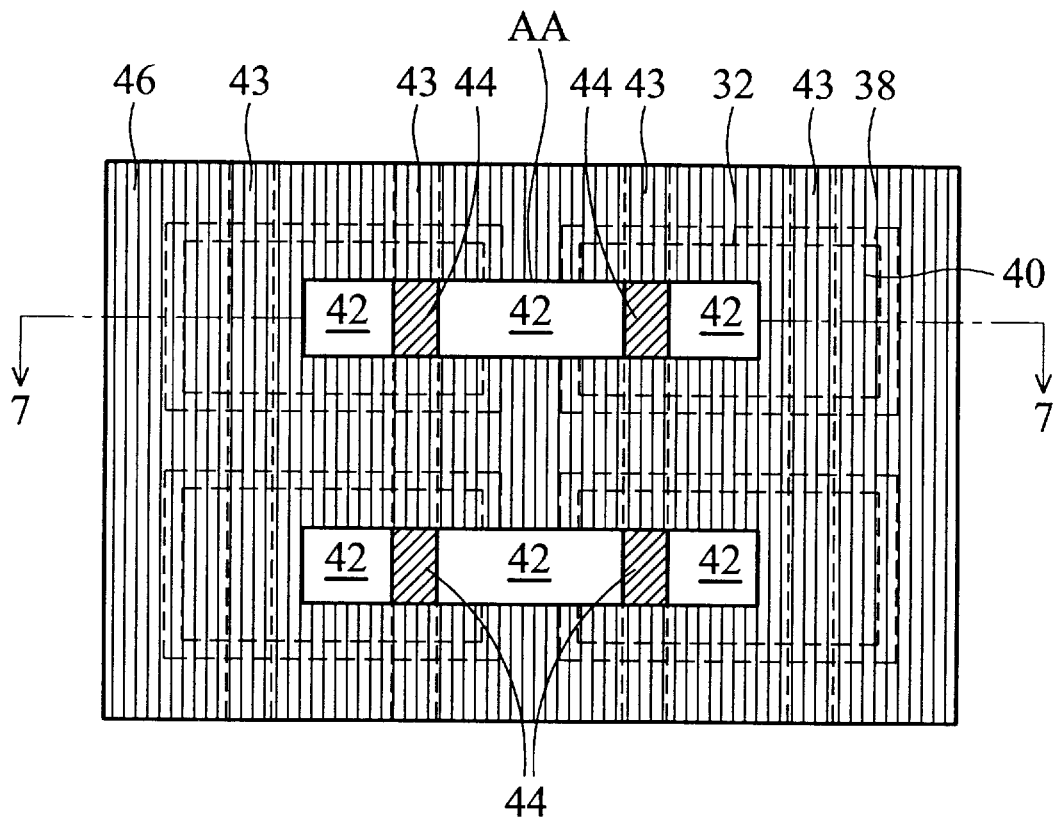
FIG. 6 is a top view showing active areas.
Figure 7:
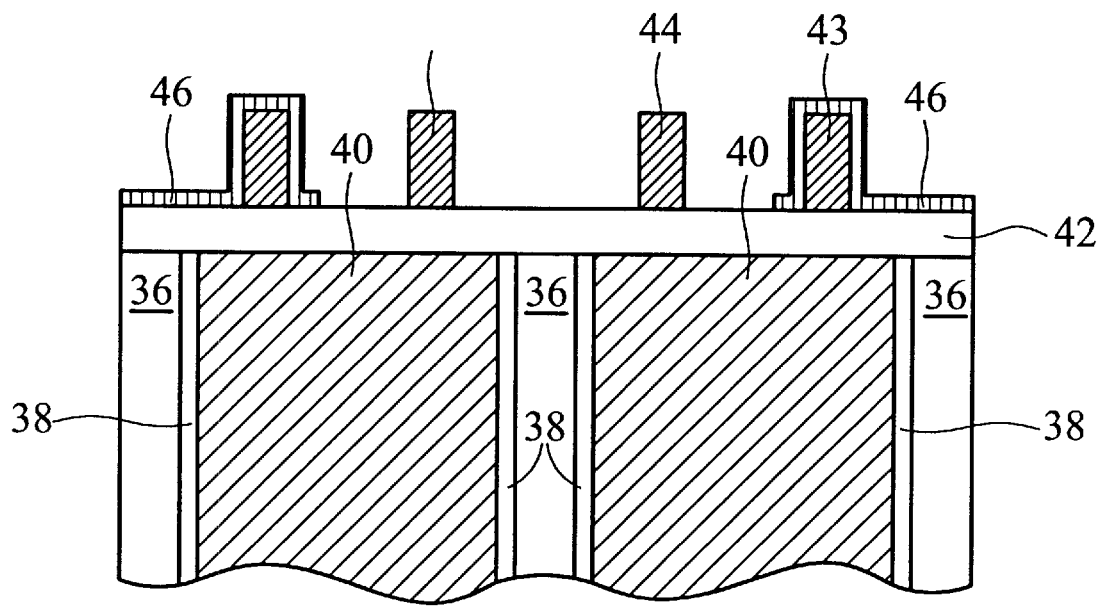
FIG. 7 is a sectional diagram along line 7—7 shown in FIG. 6.

Please refer to FIGS. 6 and 7. FIG. 6 is a top view showing active areas. FIG. 7 is a sectional diagram along line 7—7 shown in FIG. 6. After depositing a second insulating layer 46 of silicon oxide on the entire surface of the silicon substrate 30, photolithography and etching are used to remove the second insulating layer 46 within the active areas. Therefore, the word line 43 exposed within the active area serves as a control gate electrode 44.

Figure 8:
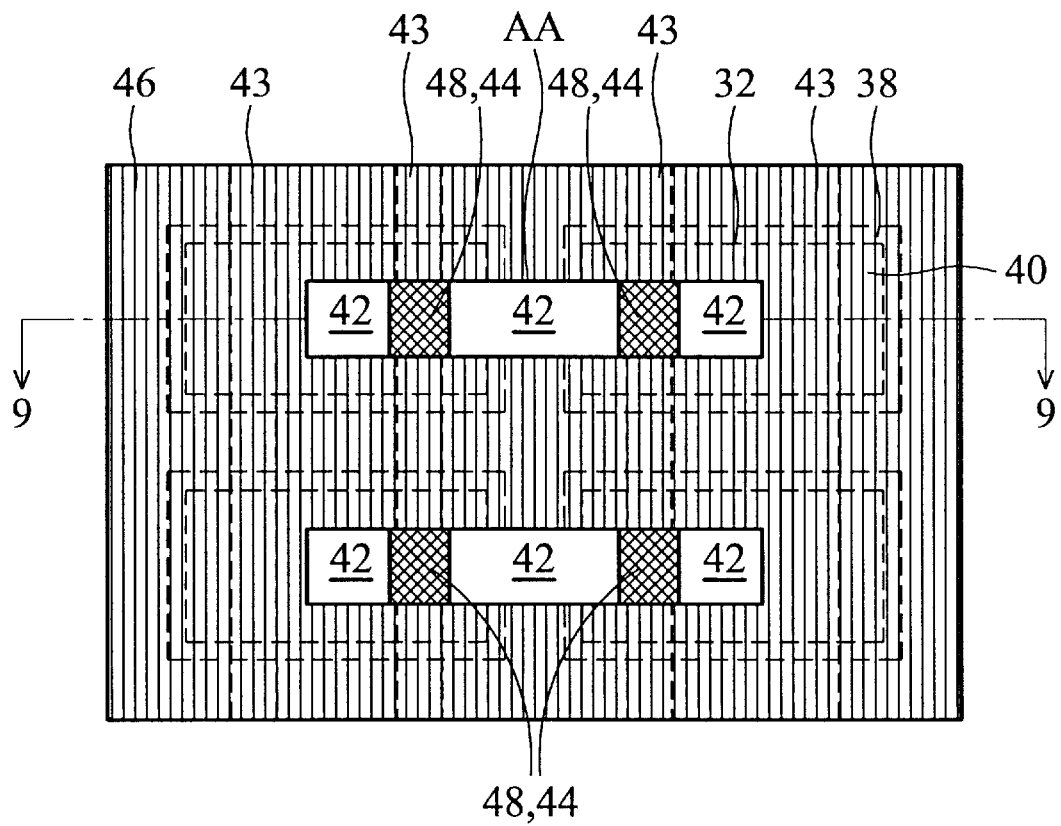
FIG. 8 is a top view showing a gate insulating layer.
Figure 9:
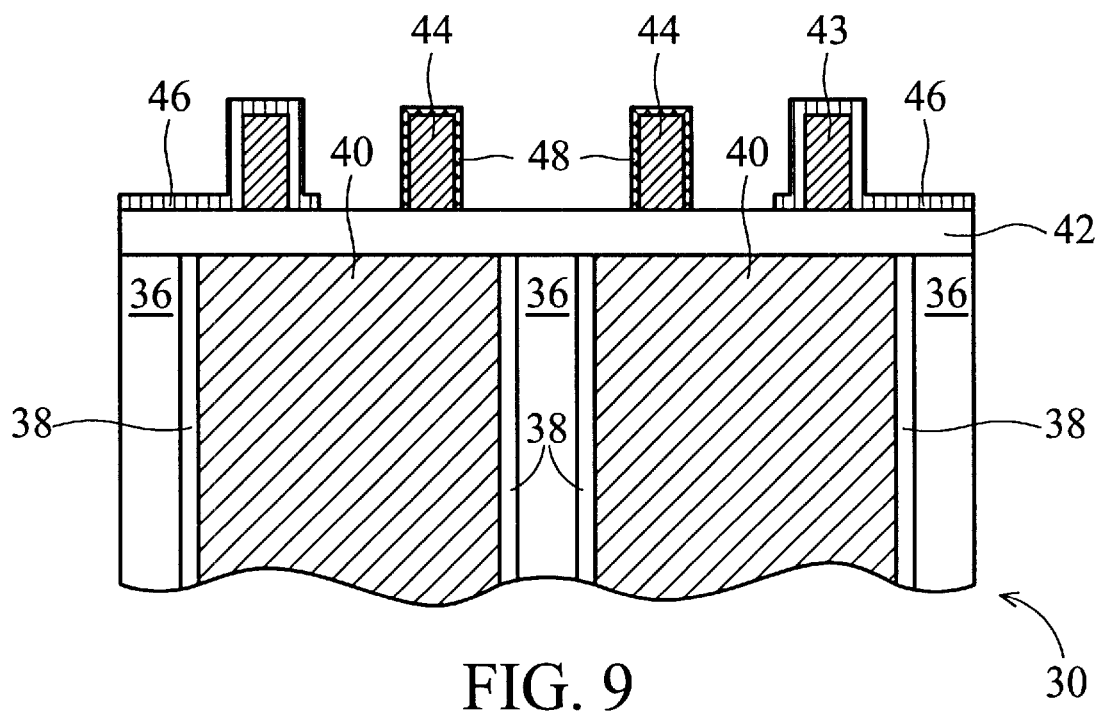
FIG. 9 is a sectional diagram along line 9—9 shown in FIG. 8.

Please refer to FIGS. 8 and 9. FIG. 8 is a top view showing a gate insulating layer. FIG. 9 is a sectional diagram along line 9—9 shown in FIG. 8. After depositing a third insulating layer 48 of silicon oxide on the entire surface of the silicon substrate 30, photolithography and etching are used to remove most of the third insulating layer 48, thus the third insulating layer 48 only remains on the sidewall and top of the control gate electrode 44 to serve as a gate insulating layer 48.

Figure 10:
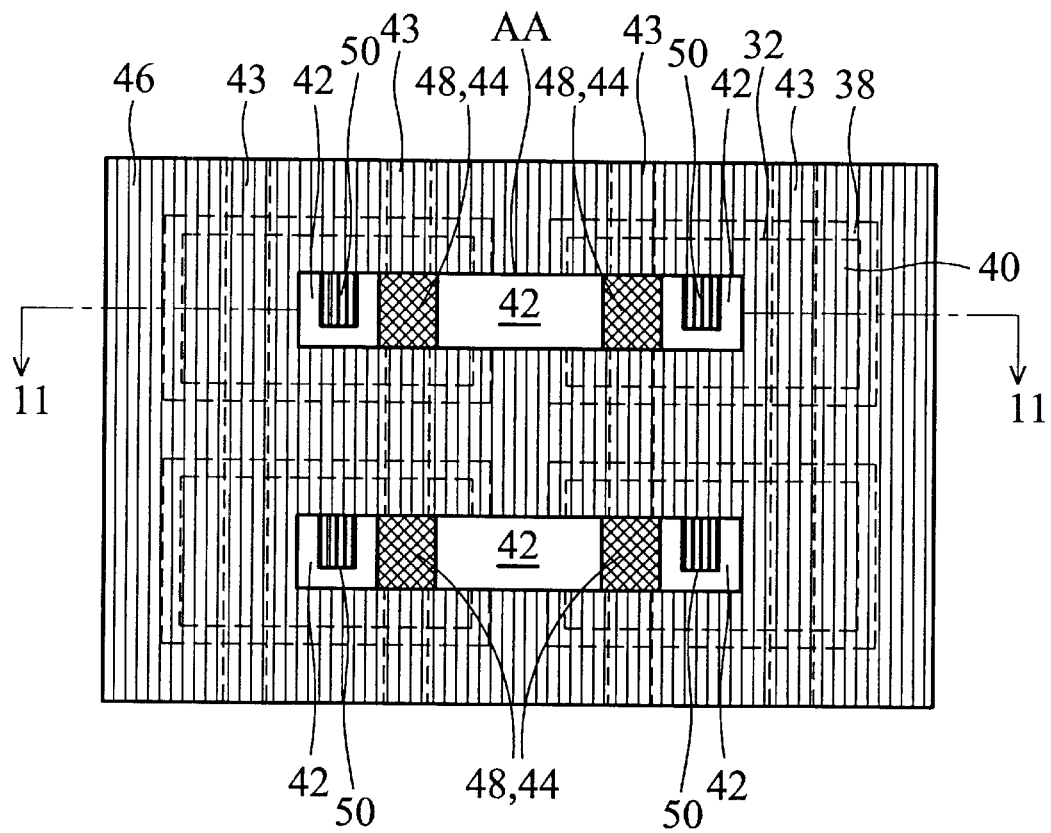
FIG. 10 is a top view showing a source region.
Figure 11:
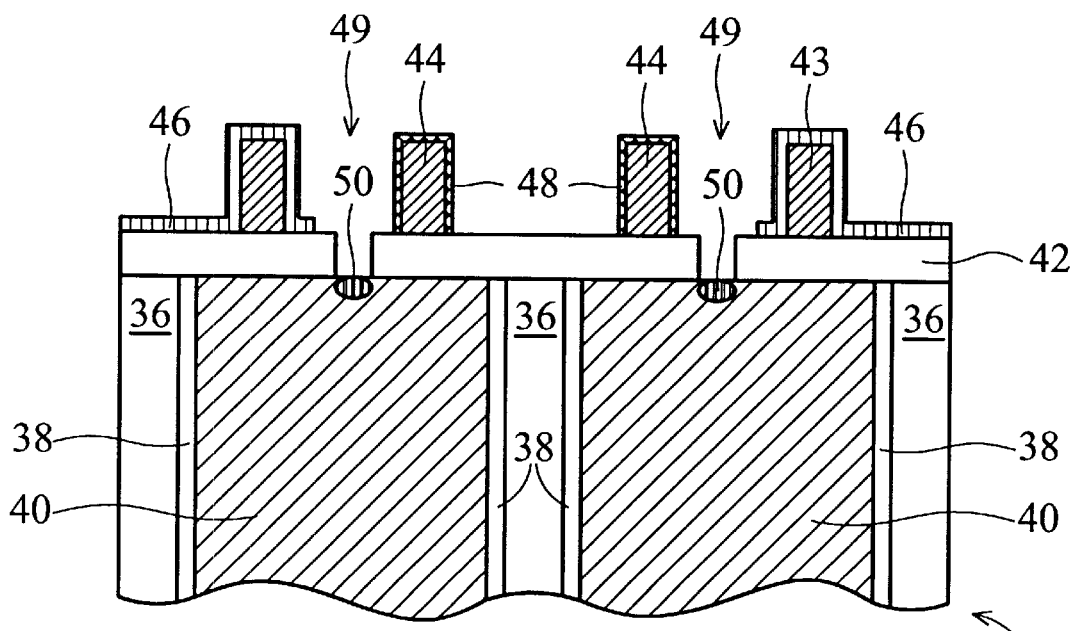
FIG. 11 is a sectional diagram along line 11—11 shown in FIG. 10.

Please refer to FIGS. 10 and 11. FIG. 10 is a top view showing a source region. FIG. 11 is a sectional diagram along line 11—11 shown in FIG. 10. Using photolithography and etching, a plurality of first contact holes 49 are formed in the exposed region of the first insulating layer 42 to expose part of the polysilicon layer 40. In each active area, two first contact holes 49 are formed outside the two control gate electrodes 44 respectively. Then, using ion implantation, an $n^+$-type doped region 50 is formed on the exposed area of the polysilicon layer 40 in the first contact hole 49 to serve as a source region 50.

Figure 12:
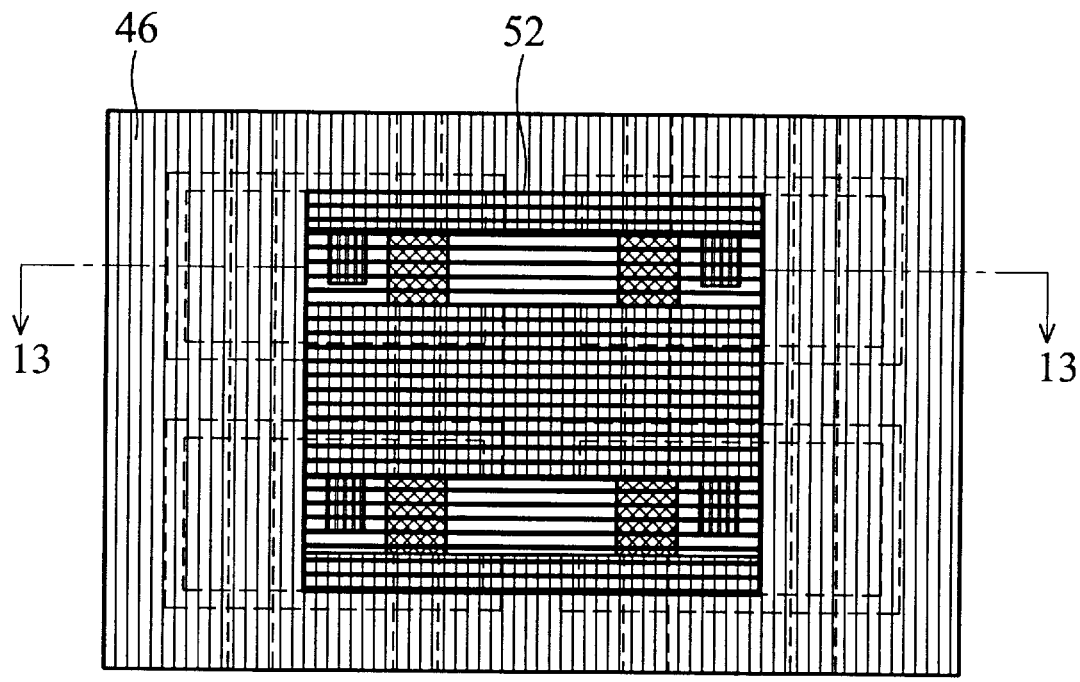
FIG. 12 is a top view showing a well Si layer.
Figure 13A:
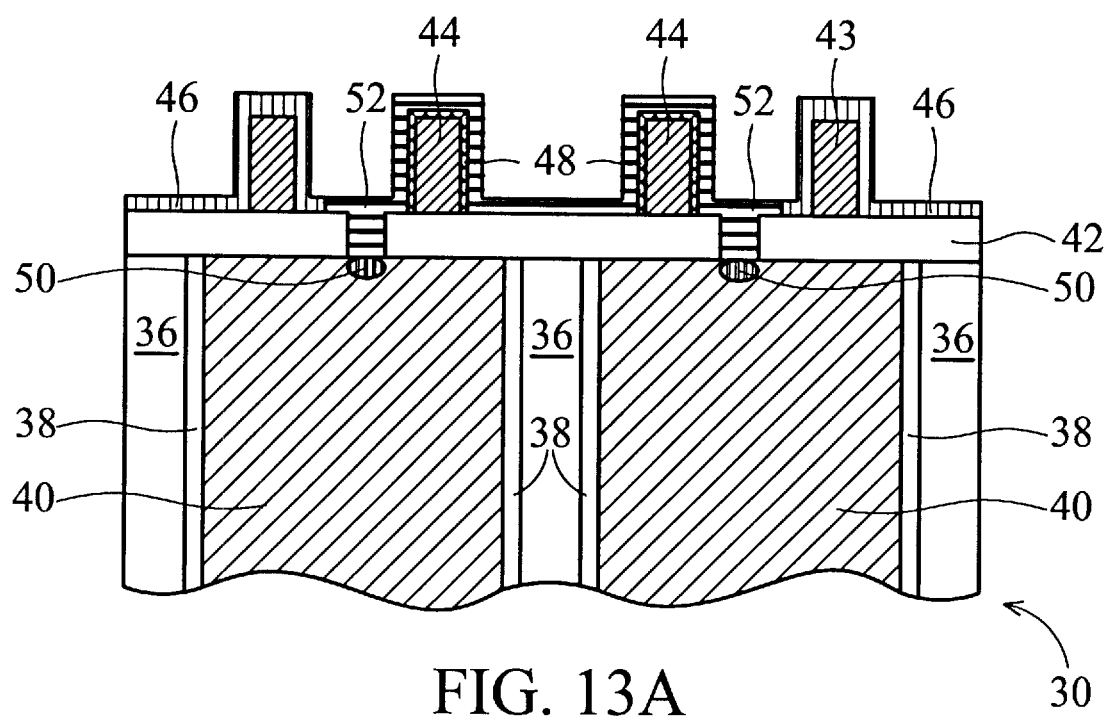
FIGS. 13A and 13B are sectional diagrams along line 13—13 shown in FIG. 12.
Figure 13B:
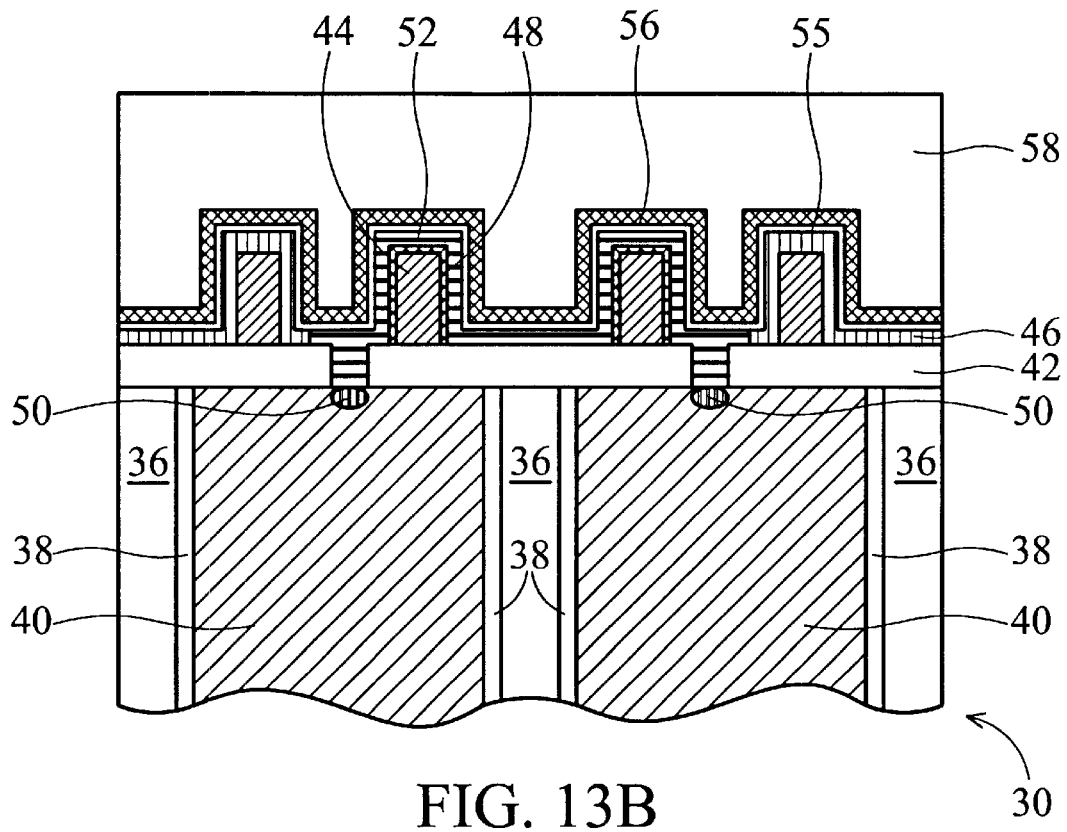

Please refer to FIGS. 12 and 13. FIG. 12 is a top view showing a well Si layer. FIGS. 13A and 13B are sectional diagrams along line 13—13 shown in FIG. 12. As shown in FIG. 13A, a well Si layer 52 is deposited on the entire surface of the silicon substrate 30 to fill the first contact holes 49, thus the well Si layer 52 is electrically connected to the source region 50. Then, using photolithography and etching, the well Si layer 52 that covers the second insulating layer 46 is removed. Next, as shown in FIG. 13B, a pad oxide layer 55, a silicon nitride liner 56 and a fourth insulating layer 58 of silicon oxide are successively deposited on the entire surface of the silicon substrate 30, and then chemical mechanical polishing (CMP) is employed to planarize the surface of the fourth insulating layer 58.

Figure 14:
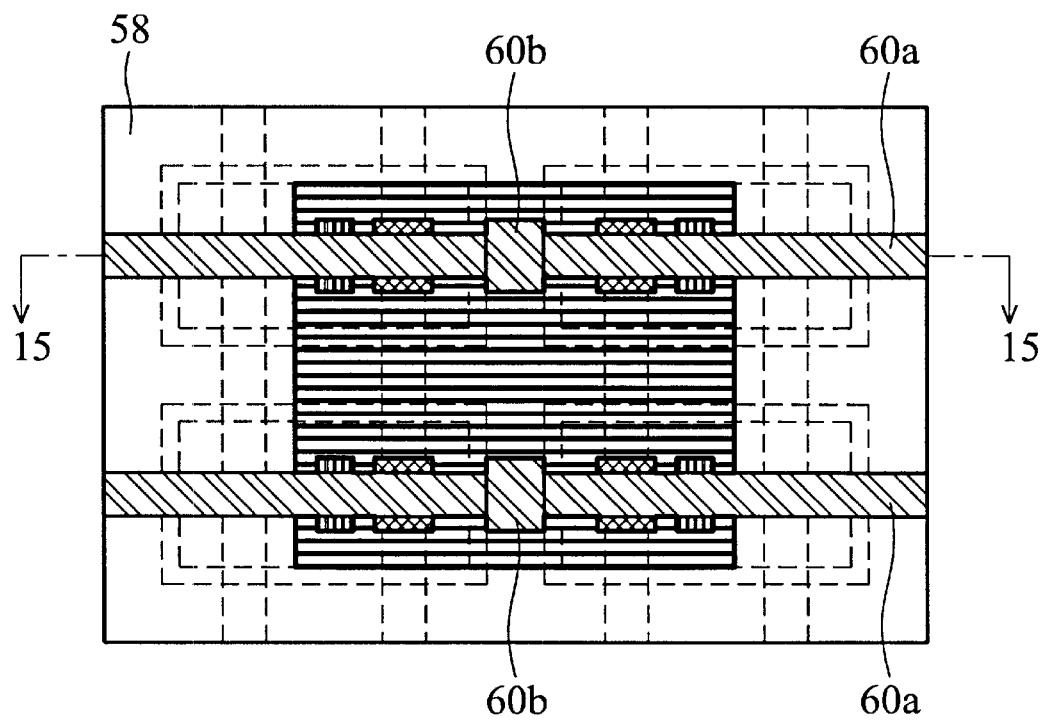
FIG. 14 is a top view showing bit lines.
Figure 15A:
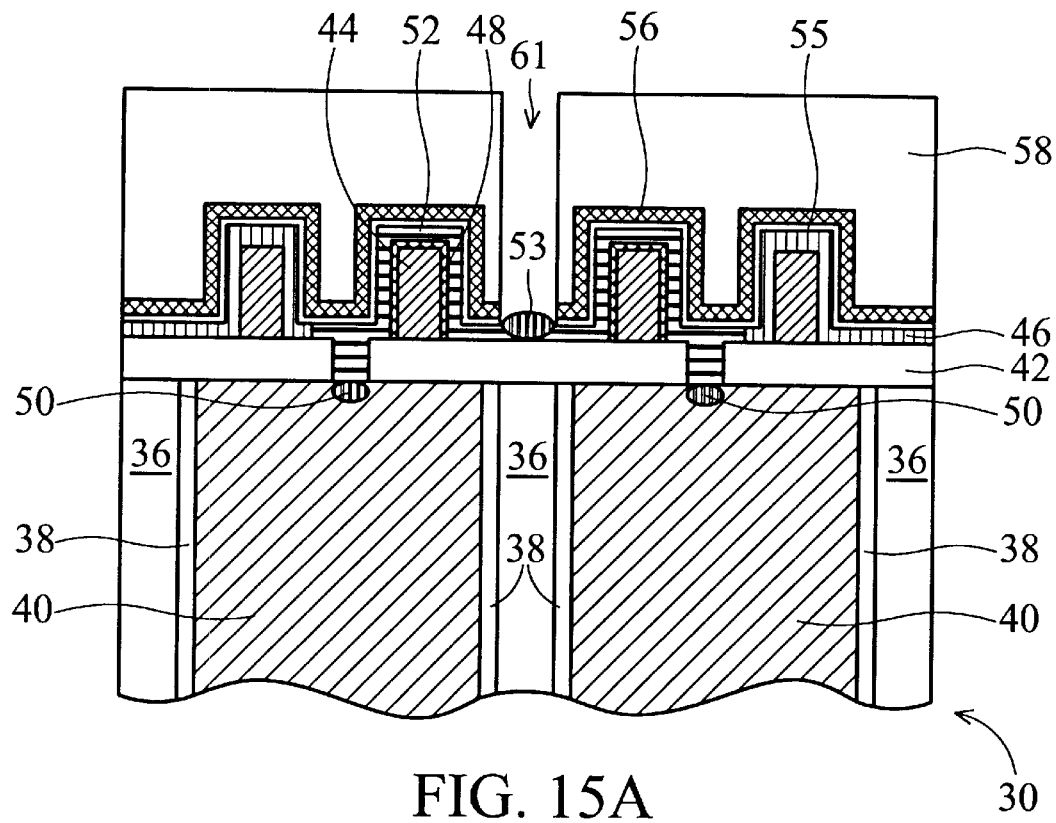
FIGS. 15A and 15B are sectional diagrams along line 15—15 shown in FIG. 14.
Figure 15B:
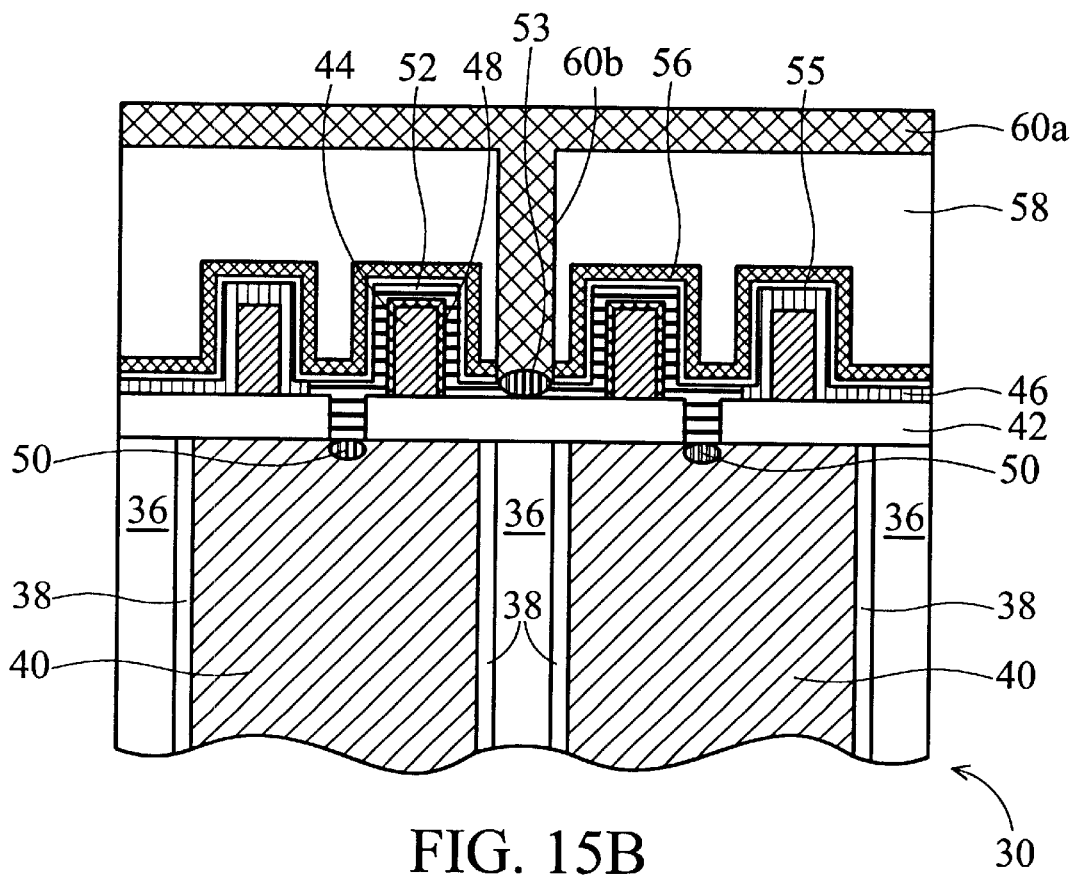

Please refer to FIGS. 14 and 15. FIG. 14 is a top view showing bit lines. FIGS. 15A and 15B are sectional diagrams along line 15—15 shown in FIG. 14. As shown in FIG. 15A, using photolithography and etching, the fourth insulating layer 58, the silicon nitride liner 56 and the pad oxide layer 55 between adjacent control gate electrodes are removed to expose part of the well Si layer 52, thus forming a second contact hole 61. Then, using ion implantation, the exposed area of the well Si layer 52 is doped to form an $n^+$-type doped region 53 that serves as a drain region 53 and is common to the two adjacent control gate electrodes 44. Therefore, a channel region between the source region 50 and th e drain region 53 surrounds the sidewall and top of the control gate electrode 44 to become an approximately n—shaped channel region. This can increase the length of the channel region to reduce leakage current without consuming lateral area of the memory cell. Finally, as shown in FIG. 15B, a conductive layer 60 is deposited on the four th insulating layer 58 to fill the second contact hole 61, and then the conductive layer 60 is patterned to become transverse-extending bit lines 60a within each active area. The conductive layer 60 remaining in the second contact hole 61 serves as a contact plug 60b.

In another preferred embodiment, the well Si layers 52 of each active area can be electrically connected to each other, and the voltage of the well Si layer 52 is modulated by bias voltage.

[Second Embodiment]

The second embodiment provides a DRAM cell applied to the open bit line structure, in which the word line and the bit line have the same length, and the size of the deep trench is approximately equal to the size of the cell. FIGS. 16A to 16G are top views showing a DRAM cell according to the second embodiment of the present invention. FIGS. 17A to 17I are sectional diagrams along line 17—17 shown in FIG. 16.

Figure 16A:
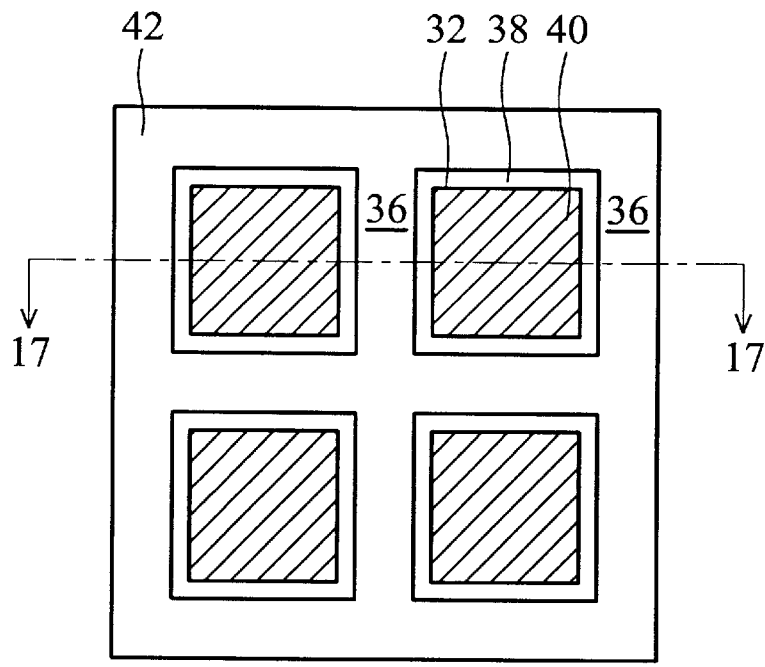
FIGS. 16A to 16G are top views showing a DRAM cell according to the second embodiment of the present invention.
Figure 17A:
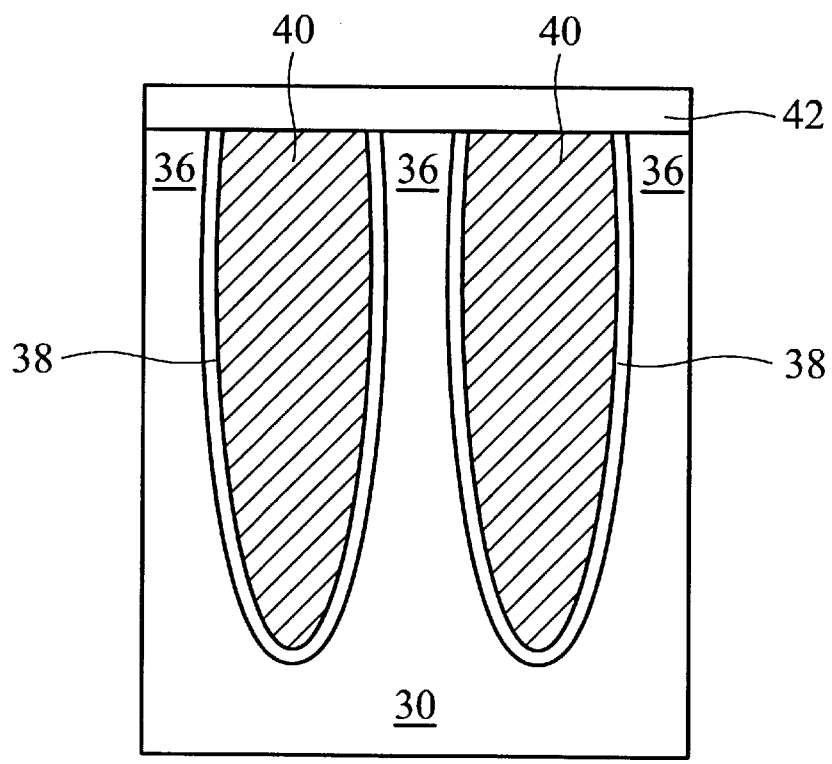
FIGS. 17A to 17I are sectional diagrams along line 17—17 shown in FIG. 16.

As shown in FIGS. 16A and 17A, according to the above-described method of forming deep trench in the first embodiment, the silicon substrate 30 has a plurality of deep trenches 32 in array, an $n^+$-type diffusion region 36 formed in the silicon substrate 30 to surround the deep trench 32, an NO dielectric layer 38 formed on the sidewall of the deep trench 32, an undoped polysilicon layer 40 filling the deep trench 32, and a first insulating layer 42 formed on the entire surface of the silicon substrate 30.

Figure 16B:
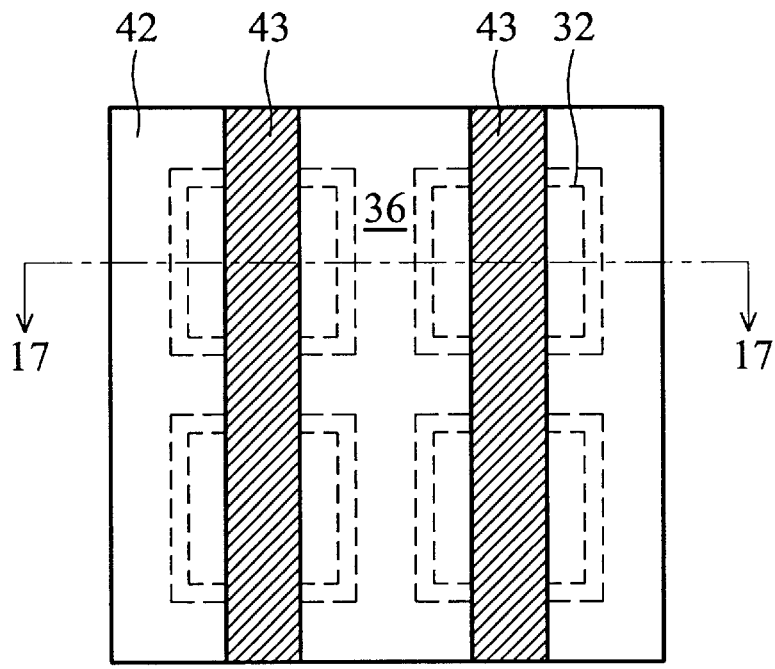
Figure 17B:
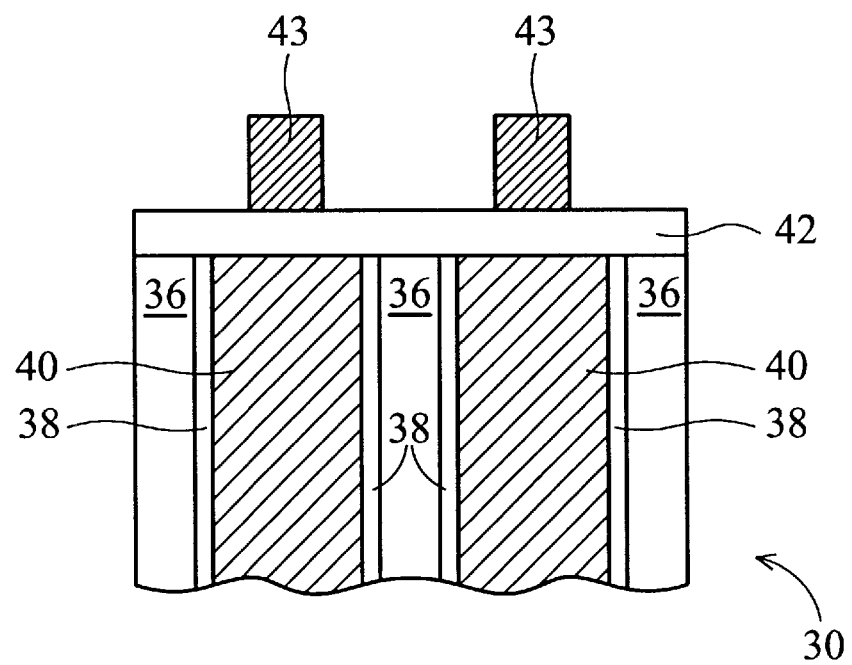
Figure 16C:
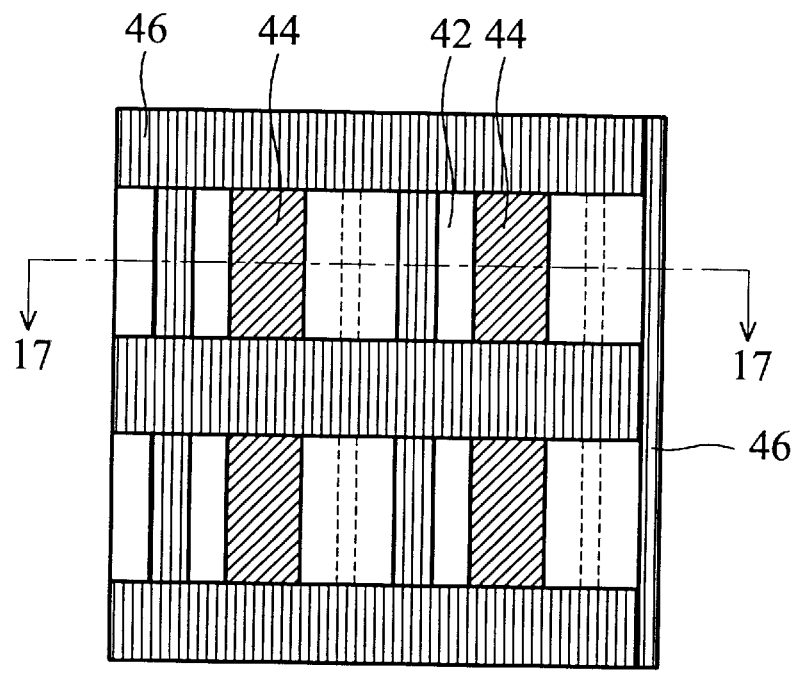
Figure 17C:
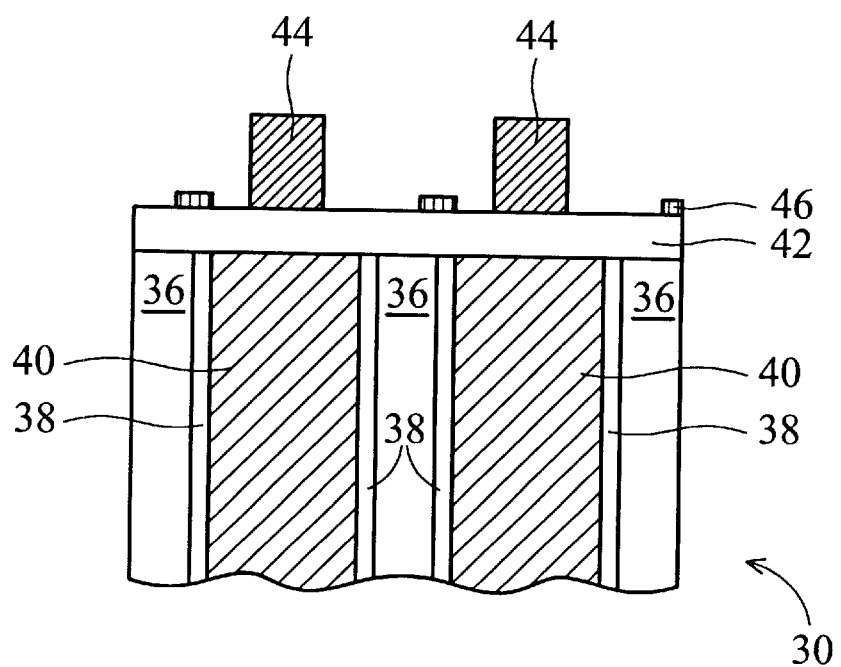
Figure 16D:
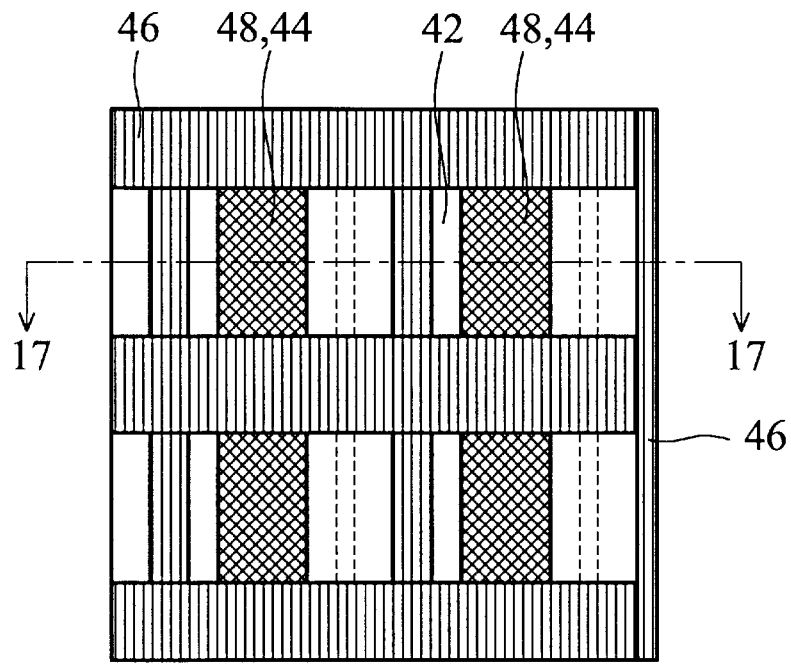
Figure 17D:
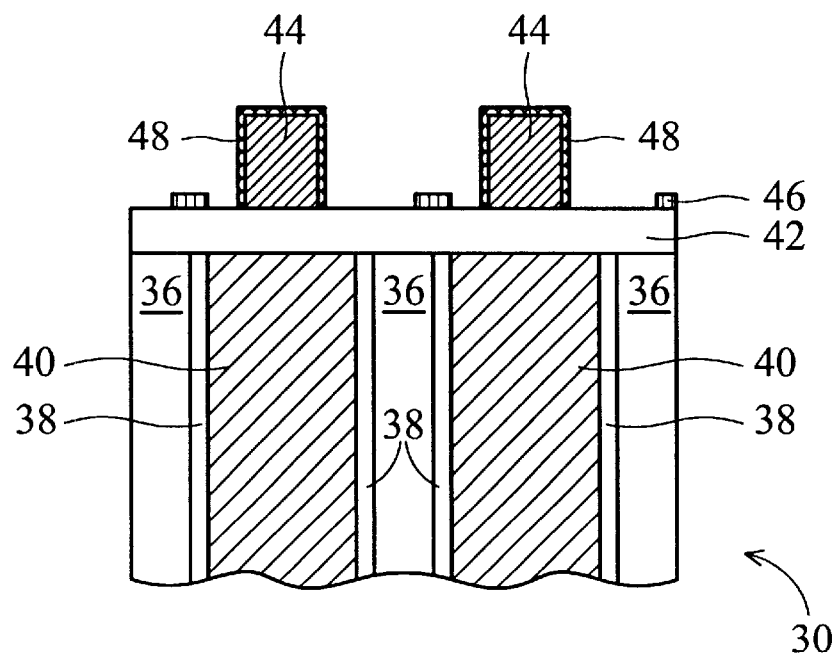

As shown in FIGS. 16B and 17B, after depositing an $n^+$-type polysilicon layer on the first insulating layer 42, photolithography and etching are used to pattern the $n^+$-type polysilicon layer as lengthwise-extending word lines 43 over the deep trenches 32 respectively. Then, as shown in FIGS. 16C and 17C, a second insulating layer 46 is deposited and patterned to expose active areas, thus the word line 43 in the active area serves as a control gate electrode 44. Next, as shown in FIGS. 16D and 17D, using deposition, photolithography and etching, a third insulating layer 48 is formed on the sidewall and top of the control gate electrode 44 to serve as a gate insulating layer 48.

Figure 16E:
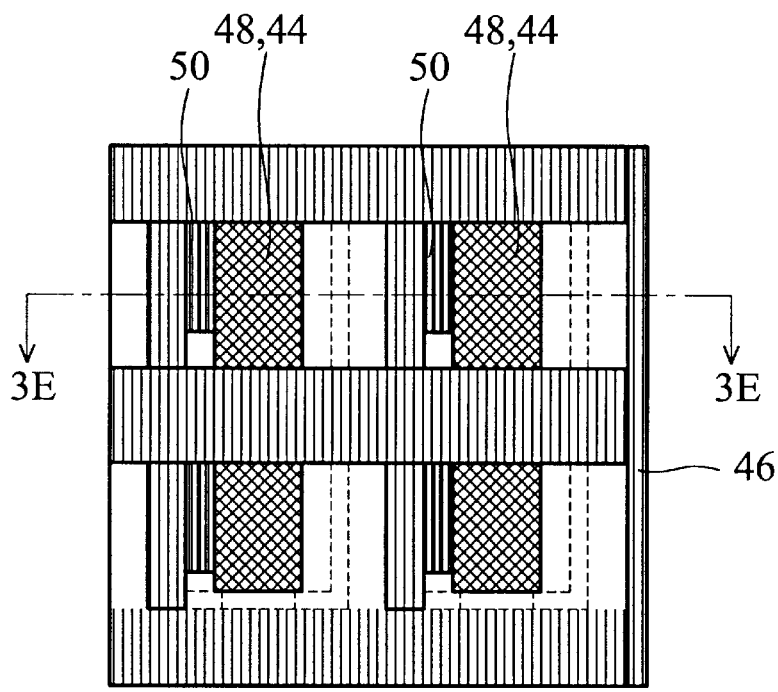
Figure 17E:
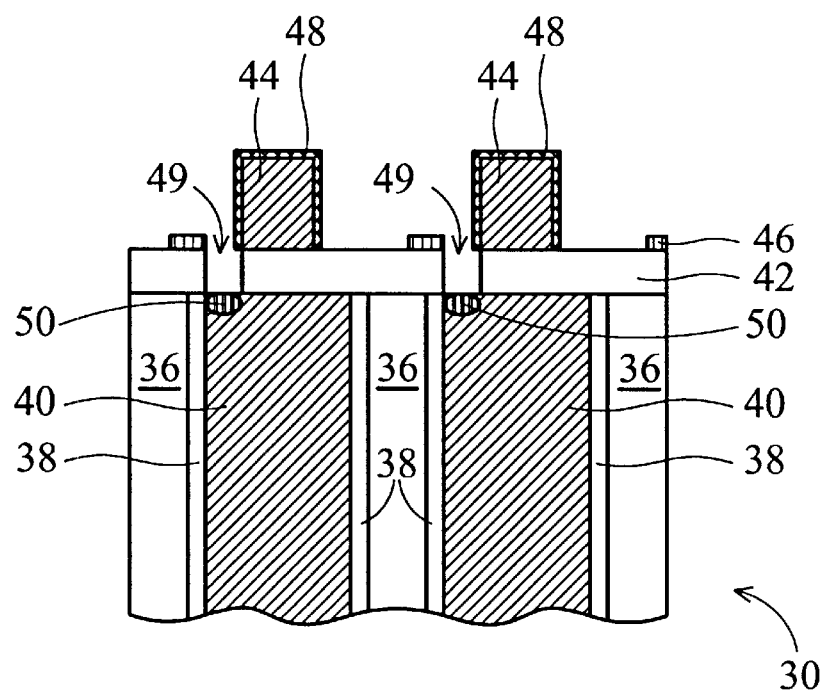

As shown in FIGS. 16E and 17E, using photolithography and etching, a plurality of first contact holes 49 is formed in the first insulating layer 42 to expose predetermined regions of the polysilicon layer 40. Over each deep trench 32, one of the first contact holes 49 is formed at one side of the control gate electrode 44. Then, using ion implantation, the exposed region of the polysilicon layer 40 is doped to form an $n^+$-type doped region 50, thus serving as a source region.

Figure 16F:
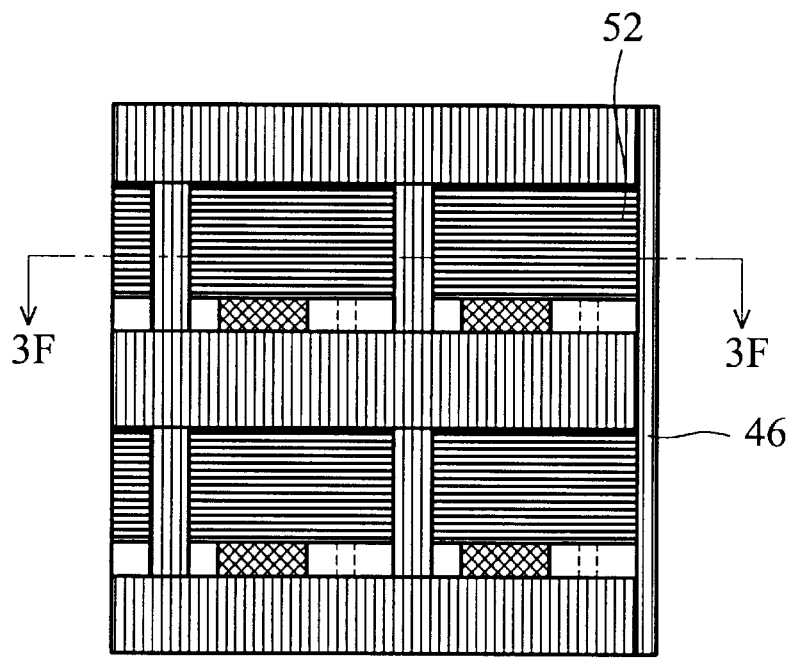
Figure 17F:
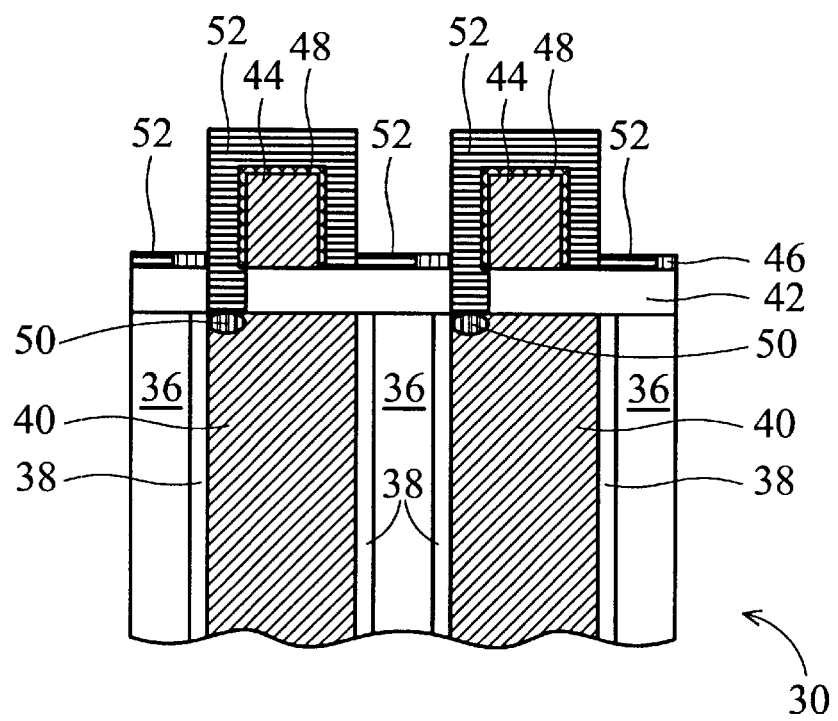
Figure 16G:
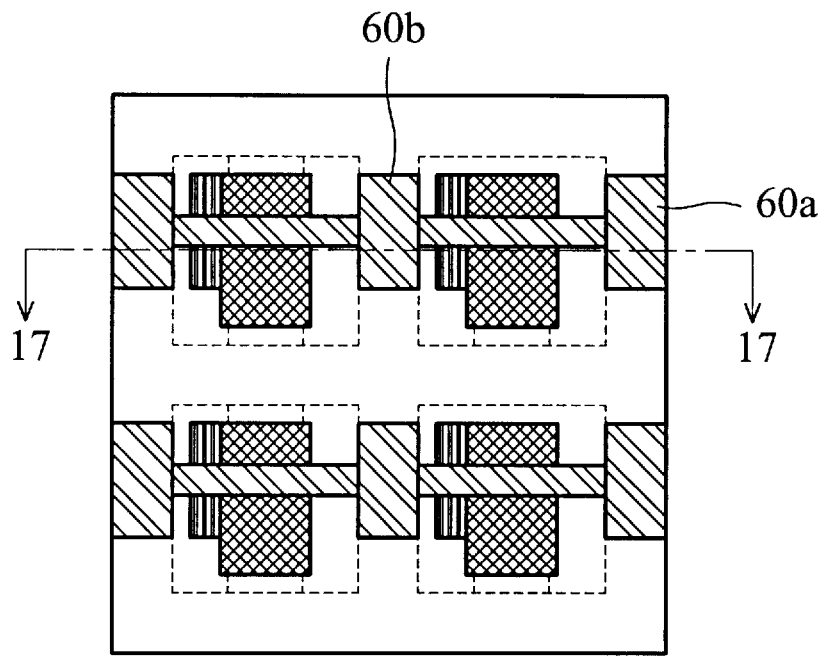

As shown in FIGS. 16F and 17F, a well Si layer 52 is deposited on the entire surface of the silicon substrate 30 to fill the first contact holes 49, thus the well Si layer 52 is electrically connected to the $n^+$-type doped region 50. Then, using photolithography and etching, the well Si layer 52 that covers the second insulating layer 46 is removed.

Figure 17G:
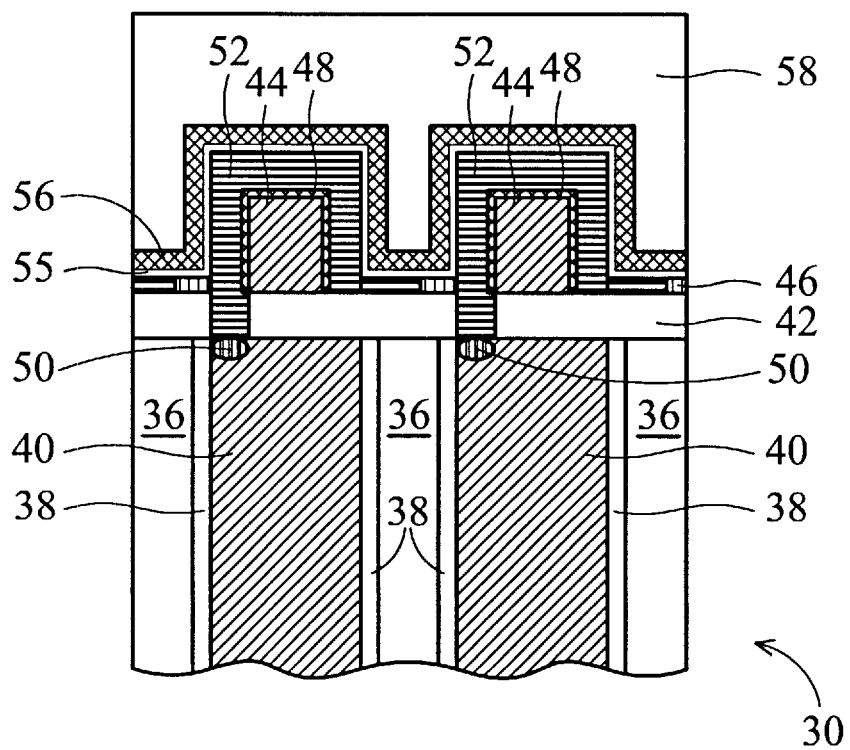
Figure 17H:
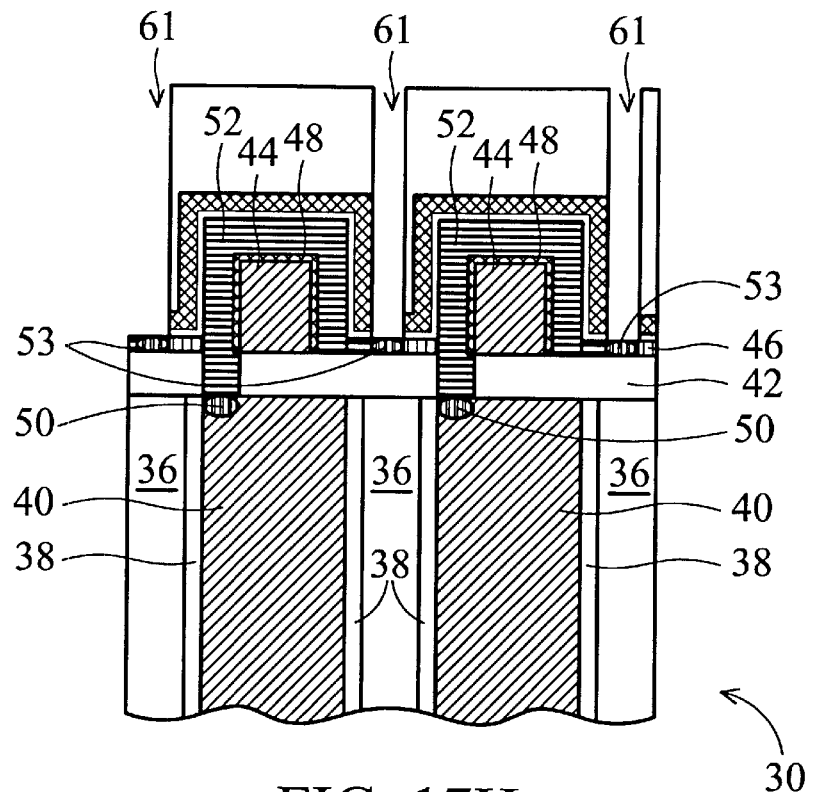

Hereinafter, as shown in FIGS. 16G and 17G~17I, bit lines can be formed according the above-described method in the first embodiment. As shown in FIG. 17G, a pad oxide layer 55, a silicon nitride liner 56 and a fourth insulating layer 58 with a planarized surface are successively formed on the entire surface of the silicon substrate 30. Then, as shown in FIG. 17H, using photolithography and etching, the fourth insulating layer 58, the silicon nitride liner 56 and the pad oxide layer 55 between adjacent control gate electrodes 44 are removed to expose the well Si layer 52, thus forming a plurality of second contact holes 61. Next, using ion implantation, the exposed region of the well Si layer 52 is formed as an $n^+$-type doped region 53 to serve as a drain region 53. Therefore, a channel region between the source region 50 and the drain region 53 surrounds the top and sidewall of the control gate electrode 44 to appear an approximately n-shaped channel region. This can increase the length of the channel region to reduce leakage current without consuming lateral size of the DRAM cell.

Figure 17I:
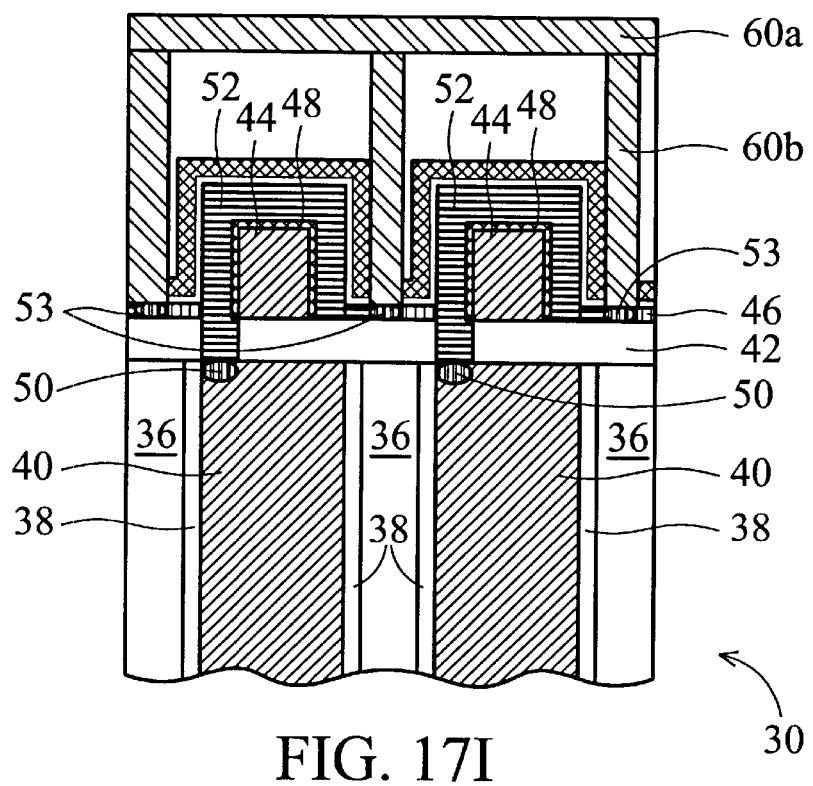

Finally, as shown in FIG. 17I, a conductive layer 60 is deposited on the fourth insulating layer 58 to fill the second contact hole 61, and then the conductive layer 60 is patterned to become transverse-extending bit lines 60a within each active area. The conductive layer 60 remaining in the second contact hole 61 serves as a contact plug 60b.

It is to be understood that the present invention is not limited to the embodiments described above, but encompasses any and all embodiments within the scope of the following claims.

What is claimed is:

1. A semiconductor memory cell, comprising:
   a substrate having a plurality of deep trenched arranged in array;
   a deep trench capacitor formed in each deep trench, wherein the deep trench capacitor comprises a storage node formed in the substrate and surrounding the deep trench, a capacitor dielectric formed on the sidewall of the deep trench, and an electrode plate filling the deep trench;
   an isolating layer covering the deep trench capacitor and having a first contact hole to expose a predetermined region of the electrode plate, wherein the exposed region of the electrode plate is a first doped region;
   a control gate electrode patterned on the isolating layer over the deep trench capacitor, wherein the first doped region is formed at one side of the control gate electrode;
   a gate insulating layer covering the sidewall and top of the control gate electrode; and
   a well Si layer covering the isolating layer, the gate insulating layer and the exposed electrode plate to fill the first contact hole, wherein the well Si layer comprises a second doped region formed at the other side of the control gate electrode.

2. The semiconductor memory cell according to claim 1, wherein the semiconductor memory cell is a folded bit line structure.

3. The semiconductor memory cell according to claim 1, wherein the second doped region is between and over two adjacent deep trench capacitors to serve as a drain region common to two adjacent control gate electrodes.

4. The semiconductor memory cell according to claim 1, wherein a channel region is formed between the first doped region and the second doped region to surround the sidewall and top of the control gate electrode.

5. The semiconductor memory cell according to claim 4, wherein the channel region is an approximate n shape.

6. The semiconductor memory cell according to claim 1, wherein the semiconductor memory cell is a dynamic random access memory (DRAM) cell.

7. A semiconductor memory cell, comprising:
a substrate having a plurality of deep trenches arranged in array;
a deep trench capacitor formed in each deep trench, wherein the deep trench capacitor comprises a storage node formed in the substrate and surrounding the deep trench, a capacitor dielectric formed on the sidewall of the deep trench, and an electrode plate filling the deep trench;
an isolating layer covering the deep trench capacitor and having a first contact hole to expose a predetermined region of the electrode plate, wherein the exposed region of the electrode plate is a first doped region;
a control gate electrode patterned on the isolating layer over the deep trench capacitor;
a gate insulating layer covering the sidewall and top of the control gate electrode; and
a well Si layer covering the exposed isolating layer and the exposed gate insulating layer, wherein one side of the well Si layer fills the first contact hole and the other side of the well Si layer is a second doped region.

8. The semiconductor memory cell according to claim 7, wherein the semiconductor memory cell is an open bit line structure.

9. The semiconductor memory cell according to claim 8, wherein the opening size of the deep trench is equal to the size of the semiconductor memory cell.

10. The semiconductor memory cell according to claim 7, wherein the first doped region and the second doped region serve as a source region and a drain region.

11. The semiconductor memory cell according to claim 7, wherein a channel region is formed between the first doped region and the second doped region to surround the sidewall and top of the control gate electrode.

12. The semiconductor memory cell according to claim 11, wherein the channel region is an approximate n shape.

13. The semiconductor memory cell according to claim 7, wherein the semiconductor memory cell is a dynamic random access memory (DRAM) cell.

14. A method of forming a semiconductor memory cell, comprising steps of:
providing a substrate having a plurality of deep trenches arranged in array;
forming a deep trench capacitor in each deep trench, wherein each deep trench capacitor comprises a storage node formed in the substrate and surrounding the deep trench, a capacitor dielectric formed on the sidewall of the deep trench, and an electrode plate filling the deep trench;
forming an isolating layer to cover the deep trench capacitors;
forming a control gate electrode over the deep trench capacitor;
forming a gate insulating layer to cover the sidewall and top of the control gate electrode;
forming a first contact hole in the gate insolating layer, wherein the first contact holes is at one side of the control gate electrode;
forming a well Si layer to cover the isolating layer and the gate insulating layer and fill the first contact hole;
forming a dielectric layer to cover the well Si layer, wherein the dielectric layer comprises a second contact hole to expose a predetermined region of the well Si layer that is at another side of the control gate electrode; and
forming a second doped region on the exposed region of the well Si layer.

15. The method of forming a semiconductor memory cell according to claim 14, further comprising steps of:
forming a conductive layer on the dielectric layer to fill the second contact hole; and
patterning the conductive layer on the dielectric layer as a bit line pattern.

16. A method of forming a semiconductor memory cell, comprising steps of:
providing a substrate having a plurality of deep trenches;
forming a deep trench capacitor in each deep trench, wherein the deep trench capacitor comprises a storage node formed in the substrate and surrounding the deep trench, a capacitor dielectric formed on the sidewall of the deep trench, and an electrode plate filling the deep trench;
forming an isolating layer to cover the deep trench capacitor;
forming a control gate electrode on the isolating layer over the deep trench capacitor;
forming a gate insulating layer to cover the sidewall and top of the control gate electrode;
forming a first contact hole in the isolating layer to expose a predetermined region of the electrode plate, wherein the first contact hole is at one side of the control gate electrode;
forming a first doped region on the exposed region of the electrode plate;
forming a well Si layer to cover the isolating layer and the gate insulating layer and fill the first contact hole;
forming a dielectric layer to cover the well Si layer, wherein the dielectric layer comprises a second contact hole to expose a predetermined region of the well Si layer that is at the other side of the control gate electrode; and
forming a second doped region on the exposed region of the well Si layer.

17. The method of forming a semiconductor memory cell according to claim 16, further comprising steps of:
forming a conductive layer on the dielectric layer to fill the second contact hole; and
patterning the conductive layer on the dielectric layer as a bit line pattern.

* * * * *